(12) United States Patent
Stuenkel et al.

(10) Patent No.: US 11,005,482 B1
(45) Date of Patent: May 11, 2021

(54) PHASE DETECTOR FOR PHASE-LOCKED LOOPS

(71) Applicant: BAE Systems Information and Electronic Systems Integration Inc., Nashua, NH (US)

(72) Inventors: Mark E. Stuenkel, Goffstown, NH (US); Mark D. Hickle, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/740,103

(22) Filed: Jan. 10, 2020

(51) Int. Cl.
| | | |
|---|---|---|
| *H03D 3/24* | (2006.01) |
| *H03L 7/087* | (2006.01) |
| *H03L 7/099* | (2006.01) |
| *H03L 7/089* | (2006.01) |

(52) U.S. Cl.
CPC ............ *H03L 7/087* (2013.01); *H03L 7/0891* (2013.01); *H03L 7/0992* (2013.01)

(58) Field of Classification Search
CPC ....... H03L 7/087; H03L 7/0992; H03L 7/091; H03L 7/0896; H03L 7/081
USPC .......................... 375/273–276, 327, 373–376
See application file for complete search history.

(56) References Cited

U.S. PATENT DOCUMENTS

| | | | | |
|---|---|---|---|---|
| 7,382,849 B1 * | 6/2008 | Groe | ...................... | H03L 7/0896 327/157 |
| 2003/0223525 A1 * | 12/2003 | Momtaz | .................. | H03L 7/081 375/376 |
| 2019/0214976 A1 * | 7/2019 | Wu | ......................... | H03L 7/091 |

OTHER PUBLICATIONS

Xiang Gao et al., "A Low Noise Sub-Sampling PLL in Which Divider Noise is Eliminated and PD/CP Noise is Not Multiplied by N2", IEEE Journal of Solid-State Circuits, Dec. 2009, pp. 3253-3263, vol. 44, No. 12.

Xiang Yi et al., "A Low Phase Noise 24/77 GHz Dual-Band Sub-Sampling PLL for Automotive Radar Applications in 65 nm CMOS Technology", School of Electrical Electronic Engineering Nanyang Technological University, 4 pages.

Teerachot Siriburanon et al., "A 60-GHz Sub-Sampling Frequency Synthesizer Using Sub-Harmonic Injection-Locked Quadrature Oscillators", IEEE, 2014, pp. 105-108.

* cited by examiner

*Primary Examiner* — Phuong Phu
(74) *Attorney, Agent, or Firm* — Finch & Maloney PLLC; Scott I Asmus

(57) ABSTRACT

Techniques are disclosed for phase detection in a phase-locked loop (PLL) control system, such as a millimeter-wave PLL. A PLL control system includes a voltage-controlled oscillator (VCO) circuit and a sub-sampling phase detector (SSPD). The VCO circuit is configured to generate an oscillating VCO output voltage based at least in part on an error signal generated by the SSPD. The error signal is proportional to a phase difference between an oscillating reference input voltage and the oscillating VCO output voltage. The SSPD includes a switched emitter-follower (SEF) sampling network, also referred to in this disclosure as an SEF circuit. In contrast to existing CMOS-based techniques, the SEF sampling network allows the SSPD to operate up to higher frequencies, for example, greater than 100 GHz, than possible using a CMOS sampler, and is also compatible with BiCMOS processes, which generally do not have access to advanced small-geometry CMOS.

19 Claims, 8 Drawing Sheets

PHASE DETECTOR FOR PHASE-LOCKED LOOPS

FIELD OF THE DISCLOSURE

This disclosure relates generally to the field of electronics, and more particularly, to techniques for phase detection in a phase-locked loop (PLL) control system.

BACKGROUND

A voltage-controlled oscillator (VCO) is an electronic circuit that produces a periodic, oscillating electronic signal, such as a sine wave or a square wave. The oscillation frequency of a VCO is controlled by a direct current (DC) tuning control voltage input. When a VCO is used in a PLL control system, the tuning control voltage input of the VCO can be varied to provide the desired output phase and frequency of the VCO. However, if the output phase of the VCO drifts away from the desired phase, a compensatory adjustment must be made to the tuning control voltage. To achieve this, the PLL control system includes a phase detector that compares the phase of the VCO output voltage to the phase of a reference input voltage and adjusts the tuning voltage to keep the input and output phases in lock step or within a threshold number of degrees of each other. However, non-trivial issues associated with maintaining a phase-locked loop signal remain due to the limitations of existing designs, particularly with respect to millimeter-wave PLL systems where low phase noise is desired for maximizing the signal-to-noise ratio (SNR).

DETAILED DESCRIPTION

Figure 1:
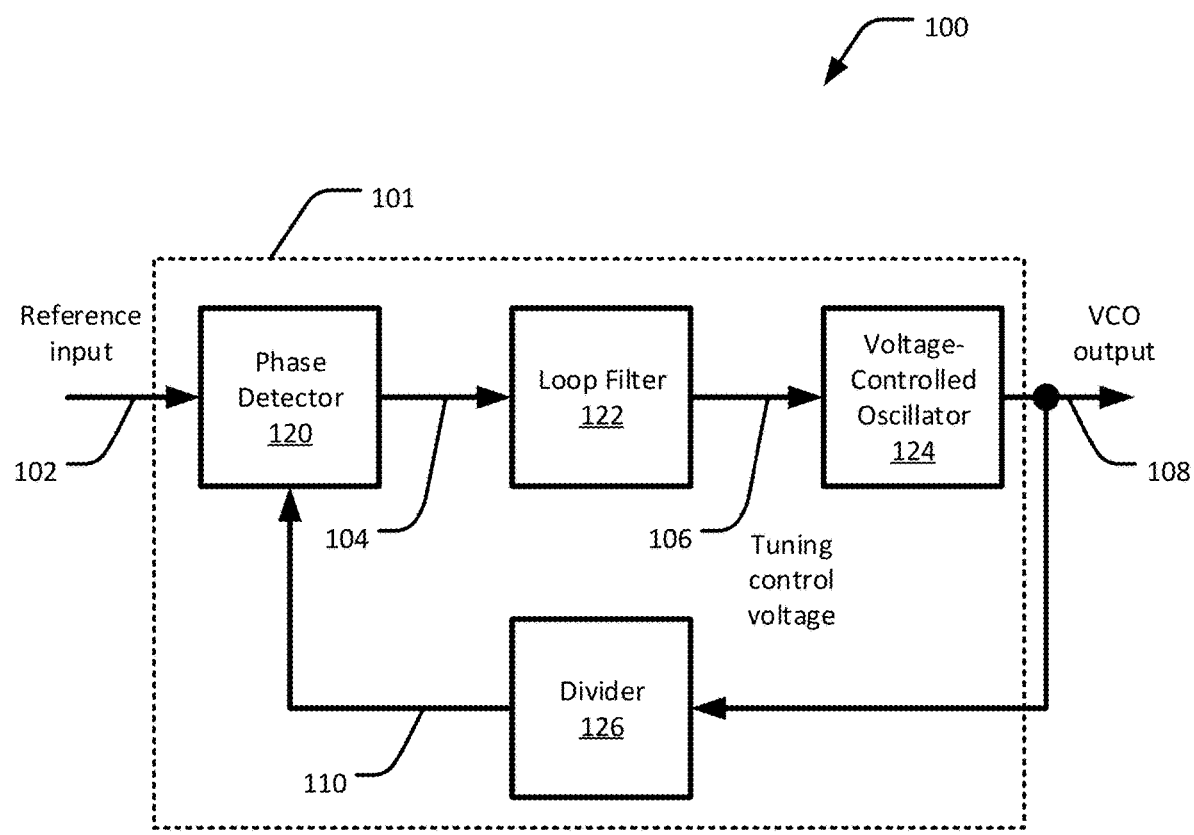
FIG. 1 is a block diagram of an example phase-locked loop (PLL) control system.

Techniques are disclosed for phase detection in a phase-locked loop (PLL) control system, such as a millimeter-wave PLL. In accordance with an embodiment of the present disclosure, a PLL control system includes a voltage-controlled oscillator (VCO) circuit and a sub-sampling phase detector (SSPD). The VCO circuit is configured to generate an oscillating VCO output voltage based at least in part on an error signal generated by the SSPD. The error signal is proportional to a phase difference between an oscillating reference input voltage and the oscillating VCO output voltage. The SSPD includes a switched emitter-follower (SEF) sampling network, also referred to in this disclosure as an SEF circuit. In contrast to existing complementary metal-oxide-semiconductor (CMOS)-based techniques, the SEF sampling network allows the SSPD to operate up to higher frequencies, for example, greater than 100 GHz, than possible using a CMOS sampler, and is also compatible with bipolar CMOS (BiCMOS) processes, which generally do not have access to advanced small-geometry CMOS. In some embodiments, the PLL control system includes a buffer circuit configured to generate an oscillating buffered VCO output voltage that is isolated from the oscillating VCO output voltage. The buffer circuit is located between the output of the VCO and the input of the SSPD to reduce or eliminate kickback from the SSPD to the VCO.

General Overview

As previously noted, there are several non-trivial issues associated with maintaining a phase-locked loop signal, particularly with respect to millimeter-wave (mmW) phase-locked loop systems. High-performance millimeter-wave PLLs are critical building blocks in many applications, such as military electronics systems. Millimeter-wave PLLs can be used as stable, low-jitter sampling clocks for data converters and as local oscillators (LOs) for radio frequency (RF) up/down-converters. PLLs should have low total integrated jitter when used as sampling clocks regardless of the spectral distribution of the phase noise, particularly when used in applications such as analog-to-digital converters, communication links and radio transceivers. When used as an LO for up/down-conversion, phase noise masks define the maximum phase noise at various offset frequencies from the carrier. Low in-band (or loop) phase noise is needed in, for example, electronic warfare and communications applications, because the total integrated noise power within the PLL system bandwidth determines the maximum achievable signal-to-noise ratio (SNR). Challenging phase noise specifications are also common outside of the system bandwidth, where strong blocker signals outside of the band can de-sense the RF receiver through reciprocal mixing of the LOs far-out phase noise. The in-band phase noise of a PLL is typically determined by the quality of the reference clock, as well as the noise contributed by the frequency divider, the phase detector, and the loop filter in some existing designs. The out-of-band phase noise is generally determined by the quality of the VCO.

As noted above, the total integrated noise power within the PLL system bandwidth determines the maximum achievable SNR. Thus, in accordance with certain embodiments of the present disclosure, the in-band phase noise can be reduced by implementing a broadband sub-sampling phase detector (SSPD), which has excellent in-band noise performance, and removing the frequency divider from the PLL system. SSPDs do not scale the phase noise contributions of the loop components because there is no divider in the system. Furthermore, eliminating the divider from the system improves the in-band phase noise by orders of magnitude due to the large divide ratios inherent in conventional mmW PLL designs. This reduction of in-band phase noise reduces overall jitter of the PLL and increases in-band SNR when used as the LO in an RF up/downconverter.

To this end, techniques are provided herein that allow a PLL system to maintain frequency lock in very high frequency operation, such as millimeter-wave frequencies, which can be achieved with current-mode switching using bipolar transistors, such as a silicon-germanium heterojunction bipolar transistor (SiGe HBT). Current-mode samplers, such as switched emitter-followers (SEFs), can be used in high-speed sampling circuits, such as mmW track-and-hold amplifiers (THAs). An SEF sampling network can be implemented in the SSPD for millimeter-wave PLLs. A SEF sampling network allows the SSPD to operate up to higher frequencies, for example, greater than 100 GHz, than possible using a CMOS sampler, and is also compatible with BiCMOS processes, which generally do not have access to advanced small-geometry CMOS. Example applications of the disclosed embodiments include, but are not limited to, applications utilizing millimeter-wave frequencies with low phase noise, such as radar, communication systems (such as military and commercial wireless systems operating above 60 GHz), electronic warfare systems, and high speed, low noise digital-to-analog converters (DACs) or analog-to-digital converters (ADCs).

Example PLL Control System with Divider

FIG. 1 is a block diagram of an example PLL control system 100 with a divider. The system 100 includes a PLL 101 having a phase/frequency detector 120, a loop filter 122, a voltage-controlled oscillator (VCO) circuit 124, and a frequency divider 126. The system 100 takes, as an input, a reference input 102 and produces an analog VCO output voltage 108. The reference input 102 and the VCO output voltage 108 are oscillating electronic signals, such as a sine wave or a square wave. The oscillation phase and frequency of the VCO 124 is a function of the reference input 102. When the VCO 124 is used in a phase-locked loop (PLL) control system, the VCO output voltage 108 is related to the phase of the reference input 102 via a loop through the phase/frequency detector 120, the loop filter 122, and the VCO 124.

In this example, the phase/frequency detector 120 receives the reference input 102 and the VCO output voltage 108 of the VCO 124. The VCO output voltage 108 can be passed through the divider 126, which is located between the VCO 124 and the phase/frequency detector 120, to make the frequency of the VCO output voltage 108 a rational multiple of the frequency of the reference input 102. The frequency/phase detector 120 compares the reference input 102 to the divided VCO output 110 and produces an error signal 104 which is proportional to the phase difference between the reference input 102 and the divided VCO output 110. When the loop is trying to achieve lock, the error signal 104 of the phase/frequency detector 120 can include high and low frequency components of the reference input 102 and/or the divided VCO output 110. The loop filter 122 includes a low pass filter to pass only the low-frequency component of the error signal 104, removing the high-frequency components, to the VCO 124 so that the loop can obtain lock between the reference input 102 and the VCO output voltage 108. The output of the loop filter 122 is a tuning control voltage 106, which is provided to control a tunable capacitance of the VCO 124.

As noted above, the total integrated noise power within the PLL system bandwidth determines the maximum achievable SNR. For instance, the in-band phase noise of the PLL system 100 is affected by the noise contributed by the frequency divider 126, among other components. The in-band phase noise can be reduced by implementing a sub-sampling phase detector (SSPD) and removing the divider from the PLL system. Sub-sampling phase detectors have excellent in-band noise performance. For instance, in contrast to PLLs which utilize frequency dividers and traditional phase detector, such as the PLL control system 100 of FIG. 1, SSPDs do not scale the phase noise contributions of the loop components by $20 \log_{10} N$, where N is the loop divider ratio, because there is no divider in the system. Eliminating the divider from the system improves the in-band phase noise by orders of magnitude due to the large divide ratios (typically greater than 100) inherent in conventional mmW PLL designs. This reduction of in-band phase noise reduces overall jitter of the PLL (important when used as a high-speed ADC sampling clock) and increases in-band SNR when used as the LO in an RF up/downconverter.

Example Divider-Less PLL Control System

Figure 2:
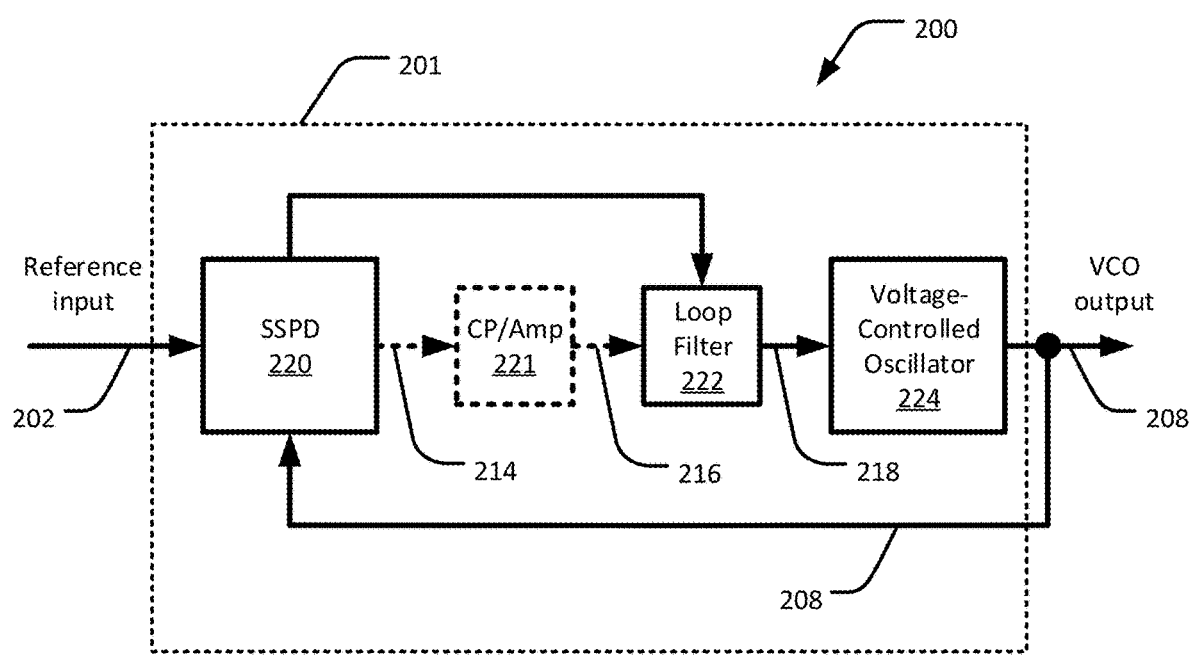
FIG. 2 is a block diagram of an example divider-less PLL control system utilizing a sub-sampling phase detector (SSPD), in accordance with an embodiment of the present disclosure.

FIG. 2 is a block diagram of an example divider-less PLL control system 200 utilizing a SSPD, in accordance with an embodiment of the present disclosure. The system 200 includes a PLL 201 having a SSPD 220, a loop filter 222, and a VCO circuit 224. In some embodiments, the system 200 further includes a charge pump (CP) and/or an amplifier (amp) 221 between the SSPD 220 and the loop filter 222, although it will be understood that the charge pump and/or the amplifier 221 are not necessarily present in every embodiment. The system 200 receives a reference input 202 and produces an analog VCO output voltage 208. The reference input 202 and the VCO output voltage 208 are oscillating electronic signals, such as a sine wave or a square wave. The oscillation phase and frequency of the VCO 224 is a function of the reference input 202. When the VCO 224 is used in a phase-locked loop (PLL) control system, the VCO output voltage 208 is related to the phase of the reference input 202 via a loop through the SSPD 220, the charge pump and/or amplifier 221 (when either or both are present), the loop filter 222, and the VCO 224.

In this example, the SSPD 220 includes a means for producing an error signal 214, which is used to control the VCO circuit 224. The SSPD 220 compares the reference input 202 to the VCO output voltage 208 and produces the error signal 214, which is proportional to a phase difference between the reference input voltage 202 and the VCO output voltage 208. The charge pump and/or the amplifier 221 (when either or both are present) receives the error signal 214 and outputs a current pulse 216 having a width approximately equal to the amount of phase difference between the reference input 202 and the VCO output voltage 208. In some embodiments, the charge pump 221 can be configured as an integrator, which yields an additional pole at direct current (DC) in the phase-domain transfer function of the PLL. The charge pump 221 thus helps to minimize the phase error between the VCO output 208 and the reference input 202. In some embodiments, the loop filter 222 can be configured to provide an additional pole at DC, and in this configuration the charge pump 221 is not needed to provide the additional pole. In some such embodiments, an amplifier can be used instead of (or in addition to) the charge pump to provide gain to the error signal 214, or both the charge pump and the amplifier can be absent. When the loop is trying to achieve lock, the current pulse 216 can include high and low frequency components of the reference input 202 and/or the VCO output 208. The loop filter 222 includes a low pass filter to pass the low-frequency component of the current pulse 216, removing the high-frequency components, to the VCO circuit 224 so that the loop can obtain lock between the reference input voltage 202 and the VCO output voltage 208. The output of the loop filter 222 is a tuning control voltage 218, which is provided to control the VCO circuit 224.

The SSPD 220 detects a phase difference between the VCO output voltage 208 and the reference input 202 by sampling the VCO output voltage waveform with a reference clock. For example, sample-and-hold and track-and-hold circuits can be used to sample the VCO output voltage 208, such as shown in FIG. 3.

Figure 3:
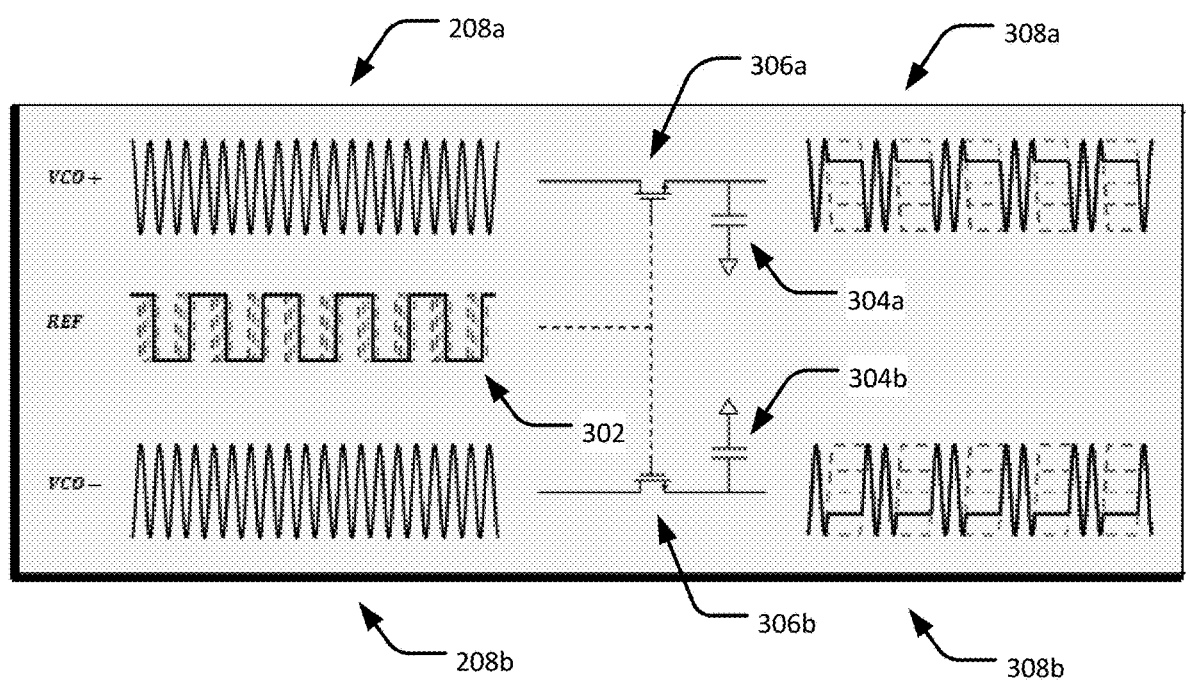
FIG. 3 shows an example operation of the SSPD of FIG. 2 when configured as a track-and-hold circuit, in accordance with an embodiment of the present disclosure.

FIG. 3 shows an example operation of the SSPD 220 of FIG. 2 when configured as a track-and-hold circuit, in accordance with an embodiment of the present disclosure. During a track phase, the non-inverting SSPD output 308a and inverting SSPD output 308b each track the non-inverting VCO output voltage 208a and the inverting VCO output voltage 208b, respectively, when the reference clock 302 is high. During a hold phase, the VCO output voltages 308a, 308b are sampled onto sampling capacitors 304a, 304b, respectively, on the falling edge of the reference clock 302 and are held at a steady state or near steady state while the reference clock 302 is low.

When the VCO 224 output frequency is an integer multiple of the reference frequency 208, the SSPD 220 yields a DC output voltage proportional to the phase difference between the VCO output voltage 208 and reference input 202 after low pass filtering via the loop filter 222.

The track-and-hold circuit in the SSPD 220 can be implemented as a switched-capacitor circuit using nMOS transistors 306a, 306b as the sampling switch, such as shown in FIG. 3. This implementation is compatible with scaled CMOS processes. However, this type of sampler has limited bandwidth and cannot operate in a robust manner at high input frequencies, such as millimeter-wave frequencies. This is especially true in older, larger CMOS technology nodes. The shunt sampling capacitor and the series on-resistance of the transistor switch form an R-C lowpass filter, which limits the bandwidth. The slew rate of the reference clock waveform further limits the sampler's maximum input frequency. As a result, some designs have been implemented in advanced small-geometry CMOS nodes (<90 nm) that operate at frequencies up to 30 GHz but are not functional at higher frequencies. However, for certain applications, it is desirable to operate at higher frequencies, such as 30-40 GHZ millimeter-wave frequencies, and to avoid the use of small-geometry CMOS or MOSFET nodes that do not support operation at such high frequencies.

To this end, as noted above, techniques are provided herein that allow a PLL system to maintain frequency lock in very high frequency operation, such as millimeter-wave frequencies, which can be achieved with current-mode switching using bipolar transistors, such as a silicon-germanium heterojunction bipolar transistor (SiGe HBT). Current-mode samplers, such as switched emitter-followers (SEFs), can be used in high-speed sampling circuits, such as mmW track-and-hold amplifiers (THAs). An SEF sampling network can be implemented in the SSPD for millimeter-wave PLLs. A SEF sampling network allows the SSPD to operate up to higher frequencies, for example, greater than 100 GHz, than possible using a CMOS sampler, and is also compatible with BiCMOS processes, which generally do not have access to advanced small-geometry CMOS. Example applications of the disclosed embodiments include, but are not limited to, applications utilizing millimeter-wave frequencies with low phase noise, such as radar, communication systems (such as military and commercial wireless systems operating above 60 GHz), electronic warfare systems, and high speed, low noise digital-to-analog converters (DACs) or analog-to-digital converters (ADCs).

System Architecture

Figure 4A:
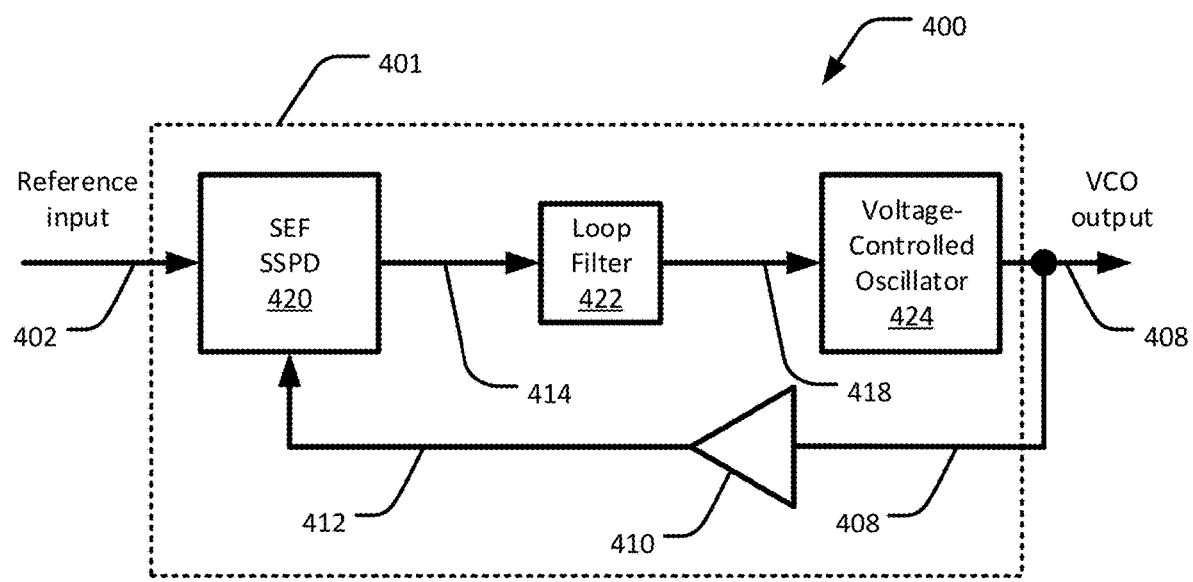
FIG. 4A is a block diagram of an example divider-less PLL control system utilizing a switched emitter-follower (SEF) SSPD, in accordance with an embodiment of the present disclosure.

FIG. 4A is a block diagram of an example divider-less PLL control system 400 utilizing a SEF SSPD, in accordance with an embodiment of the present disclosure. The system 400 includes a PLL 401 having a SSPD 420, a loop filter 422, a VCO circuit 424, and a VCO buffer 410. The VCO buffer 410 is located between the output of the VCO 424 and the input of the SSPD 420. The system 400 receives a reference input voltage 402 and produces an analog VCO output voltage 408. The reference input 402 voltage and the VCO output voltage 408 are oscillating electronic signals, such as a sine wave or a square wave. The oscillation phase and frequency of the VCO circuit 424 is a function of the reference input voltage 402. When the VCO circuit 424 is used in a phase-locked loop (PLL) control system, the VCO output voltage 408 is related to the phase of the reference input voltage 402 via a loop through the SSPD 420, the loop filter 422, the VCO circuit 424, and the VCO buffer 410, which provides a buffered VCO output voltage 412 based on the VCO output voltage 408.

In this example, the SSPD 420 includes a means for producing an error signal 414, which is used to control the VCO circuit 424. The SSPD 420 compares the reference input 402 to the buffered VCO output voltage 412 and produces the error signal 414, which is proportional to a phase difference between the reference input voltage 402 and the buffered VCO output voltage 412. The error signal 414 can, in some embodiments, include a current pulse having a width approximately equal to the amount of phase difference between the reference input 402 and the buffered VCO output voltage 412. When the loop is trying to achieve lock, the error signal 414 can include high and low frequency components of the reference input 402 and/or the buffered VCO output 412. The loop filter 422 includes a low pass filter to pass the low-frequency component of the error signal 414, removing the high-frequency components, to the VCO circuit 424 so that the loop can obtain lock between the reference input voltage 402 and the buffered VCO output voltage 412. The output of the loop filter 422 is a tuning control voltage 418, which is provided to control the VCO circuit 424.

Figure 5:
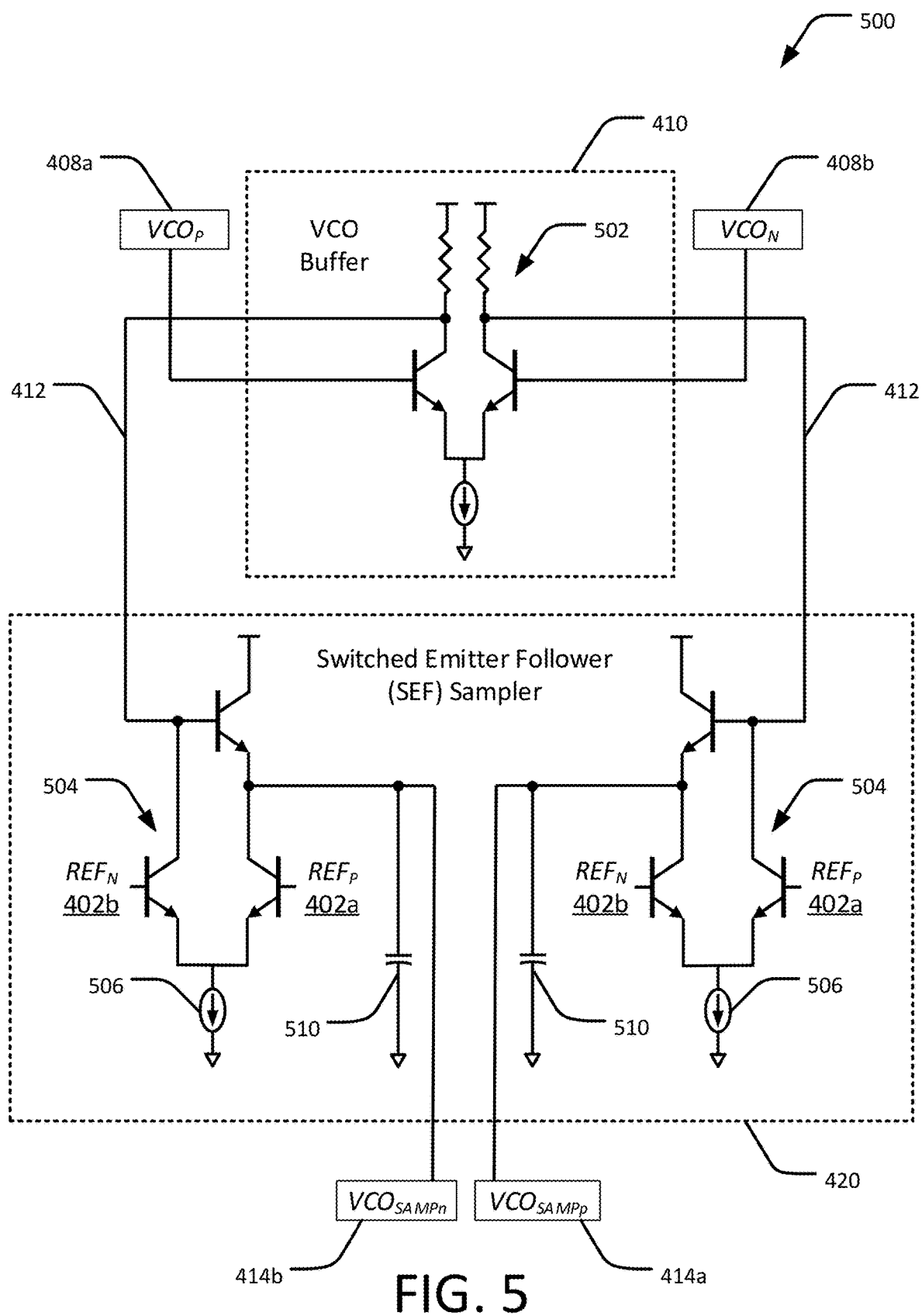
FIG. 5 shows an example of a SEF sampling network for use in a PLL system, in accordance with an embodiment of the present disclosure.

The SSPD 420 detects the phase difference between the VCO output voltage 408 and the reference input voltage 402 by sampling the VCO output voltage waveform with a reference clock. For example, a track-and-hold circuit can be used to sample the VCO output voltage 408, such as shown in FIG. 5. In contrast to the PLL control system 100 of FIG. 1, the PLL control system 400 does not include a divider. Instead, the SSPD 420 directly compares the buffered VCO output voltage 412 with the reference input voltage 402, eliminating the noise contributions of the divider of FIG. 1.

Figure 4B:
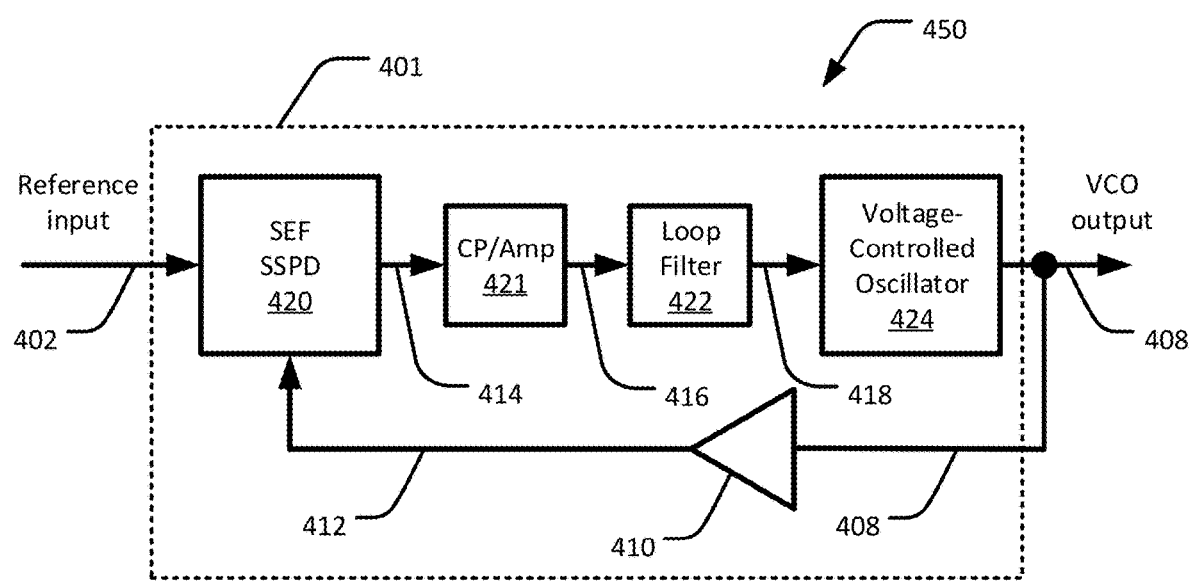
FIG. 4B is a block diagram of an example divider-less PLL control system utilizing a switched emitter-follower (SEF) SSPD, in accordance with another embodiment of the present disclosure.

FIG. 4B is a block diagram of an example divider-less PLL control system 450 utilizing a SEF SSPD, in accordance with an embodiment of the present disclosure. The system 450 includes a PLL 401 having a SSPD 420, a charge pump and/or an amplifier 421, a loop filter 422, a VCO circuit 424, and a VCO buffer 410. The VCO buffer 410 is located between the output of the VCO 424 and the input of the SSPD 420. The system 450 receives a reference input voltage 402 and produces an analog VCO output voltage 408. The reference input 402 voltage and the VCO output voltage 408 are oscillating electronic signals, such as a sine wave or a square wave. The oscillation phase and frequency of the VCO circuit 424 is a function of the reference input voltage 402. When the VCO circuit 424 is used in a phase-locked loop (PLL) control system, the VCO output voltage 408 is related to the phase of the reference input voltage 402 via a loop through the SSPD 420, the charge pump 421, the loop filter 422, the VCO circuit 424, and the VCO buffer 410, which provides a buffered VCO output voltage 412 based on the VCO output voltage 408. In this example, the SSPD 420 includes a means for producing an error signal 414, which is used to control the VCO circuit 424. The SSPD 420 compares the reference input 402 to the buffered VCO output voltage 412 and produces the error signal 414, which is proportional to a phase difference between the reference input voltage 402 and the buffered VCO output voltage 412.

In contrast to the system 400 of FIG. 4A, the system 450 can include the charge pump and/or the amplifier 221 between the SSPD 420 and the loop filter 422 to process the error signal 414. The charge pump 221 can be configured as an integrator, which yields an additional pole at direct current (DC) in the phase-domain transfer function of the PLL. The charge pump 221 thus helps to minimize the phase error between the VCO output 408 and the reference input 402. In some embodiments, the loop filter 422 can be configured to provide an additional pole at DC, and in this configuration the charge pump 221 is not needed to provide the additional pole. In some such embodiments, an amplifier can be used instead of (or in addition to) the charge pump to provide gain to the error signal 414, or both the charge pump and the amplifier can be absent, such as shown in FIG. 4A.

Referring again to FIG. 4B, the charge pump and/or the amplifier 421 (when either or both are present) receives the error signal 414 and outputs a current pulse 416 having a width approximately equal to the amount of phase difference between the reference input 402 and the buffered VCO output voltage 412. When the loop is trying to achieve lock, the current pulse 416 can include high and low frequency components of the reference input 402 and/or the buffered VCO output 412. The loop filter 422 includes a low pass filter to pass the low-frequency component of the current pulse 416, removing the high-frequency components, to the VCO circuit 424 so that the loop can obtain lock between the reference input voltage 402 and the buffered VCO output voltage 412. The output of the loop filter 422 is a tuning control voltage 418, which is provided to control the VCO circuit 424.

The SSPD 420 detects the phase difference between the VCO output voltage 408 and the reference input voltage 402 by sampling the VCO output voltage waveform with a reference clock. For example, a track-and-hold circuit can be used to sample the VCO output voltage 408, such as shown in FIG. 5. In contrast to the PLL control system 100 of FIG. 1, the PLL control system 400 does not include a divider. Instead, the SSPD 420 directly compares the buffered VCO output voltage 412 with the reference input voltage 402, eliminating the noise contributions of the divider of FIG. 1.

FIG. 5 shows an example of a SEF sampling network 500 for use in a PLL system, in accordance with an embodiment of the present disclosure. A switched emitter-follower configuration is used in the SEF sampling network 500 instead of a metal-oxide-semiconductor field-effect transistor (MOSFET) circuit, as in the PLL control system 100 of FIG. 1 and in the track-and-hold circuit of FIG. 3. The SEF sampling network 500 includes the VCO buffer 410 and SSPD 420 of FIG. 4. The VCO buffer 410 is located between the output of the VCO 424 and the input of the SSPD 420.

The input to the VCO buffer 410 is the VCO output voltage 408, indicated in FIG. 5 at 408a (non-inverting) and 408b (inverting). The output of the SSPD 420 is the error signal (VCO sampled voltage) 414a/b, which is fed to the charge pump and/or the amplifier 221 of FIG. 4B (when present), or directly into the loop filter 422 as shown in FIG. 4A.

The VCO buffer 410 includes a common-emitter differential pair amplifier 502 configured to generate a buffered VCO output voltage 412, which feeds an SEF sampler of the SSPD 420. The differential pair amplifier 502 is a type of electronic amplifier that amplifies the difference between two input voltages but suppresses any voltage common to the two inputs. The differential pair amplifier 502 has two input voltages, the non-inverting oscillating VCO output voltage 408a and the inverting oscillating VCO output voltage 408b. The differential pair amplifier 502 produces the oscillating buffered VCO output voltage 412, which is proportional to the difference between the two input voltages 408a and 408b. The design of the differential pair amplifier 502 is largely immune to, among other things, high gain, high input impedance, medium/low output impedance, and large output voltage swings. Thus, the VCO buffer 410 reduces or eliminates kickback from the SSPD 420 to the VCO 224 by isolating the output 412 of the VCO buffer 410 from the VCO output voltage 408.

The SSPD 420 of the SEF sampling network 500 includes an emitter-follower circuit 504 with a switched current source 506 that drives a sampling capacitor 510 using a reference input 402, such as the square wave reference clock REF 302 of FIG. 3 (in FIG. 5, the non-inverting and inverting REF signals into the emitter-follower circuit 504 are indicated as $REF_P$ 402a and $REF_N$ 402b, respectively). In some embodiments, the emitter-follower circuit 504 includes one or more SiGE HBTs. During a track phase, while the reference clock is high, bias current flows through the emitter-follower circuit 504, and the output 414 (indicated in FIG. 5 as 414a (non-inverting) and 414b (inverting)) of the SEF sampling network 500 tracks the oscillating buffered output 412 of the VCO buffer 410. During a hold phase, while the reference clock REF is low, the current source to the emitter-follower circuit 504 is cut off, and the input voltage 412 is sampled and held at a steady state across the sampling capacitor 510. The emitter-follower circuit 504 drives the sampling capacitor 510 at very high frequencies due to the low output impedance looking into the emitter of the SiGe HBT.

Example Methodologies

Figure 6:
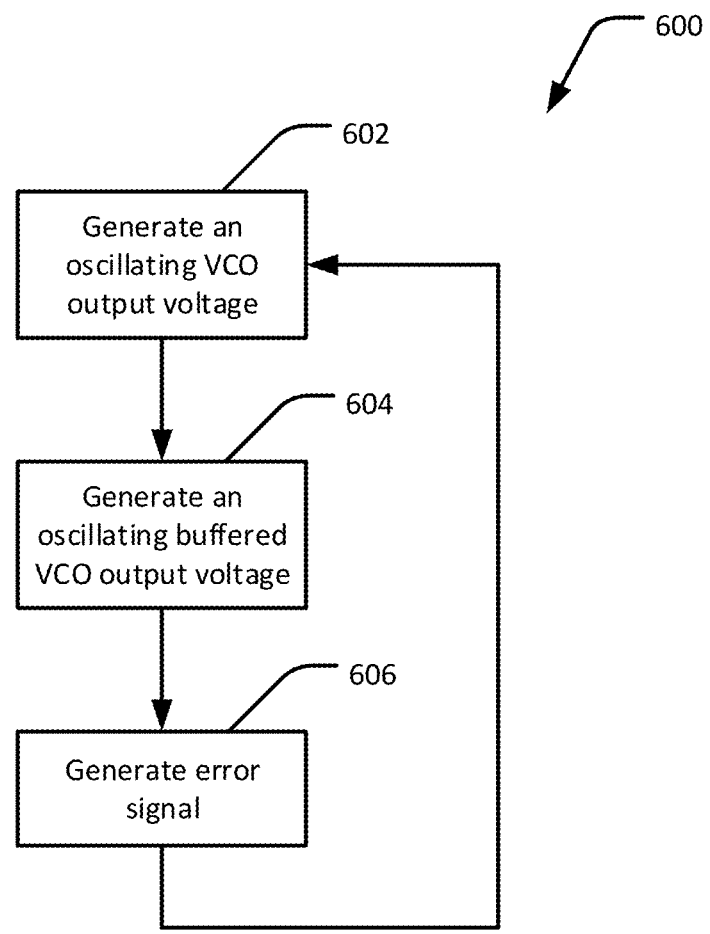
FIG. 6 is a block diagram of an example method of controlling a phase-locked loop control system, in accordance with an embodiment of the present disclosure.

FIG. 6 is a block diagram of an example method 600 of controlling a phase-locked loop control system, in accordance with an embodiment of the present disclosure. The method 800 can be implemented, for example, by one or more of the components of the system 200, 400, and 500 shown in FIG. 2-5. The method 600 includes generating 602, by a voltage-controlled oscillator circuit, an oscillating VCO output voltage based at least in part on an error signal that is proportional to a phase difference between an oscillating reference input voltage and the oscillating VCO output voltage. For example, the oscillating VCO output voltage can be generated by the VCO circuit 424 of FIG. 4. The method 600 further includes generating 604, by a buffer circuit in electronic communication with the VCO circuit, an oscillating buffered VCO output voltage that is based on and isolated from the oscillating VCO output voltage. For example, the oscillating buffered VCO output voltage can be generated by the VCO buffer 410 of FIG. 4. The method 600 further includes generating 606, by a sub-sampling phase detector in electronic communication with the buffer circuit, the error signal based on the oscillating reference input voltage and the oscillating buffered VCO output voltage, the sub-sampling phase detector including a switched emitter-follower circuit. For example, the error signal can be generated by the SEF SSPD 420 of FIG. 4.

Figure 7:
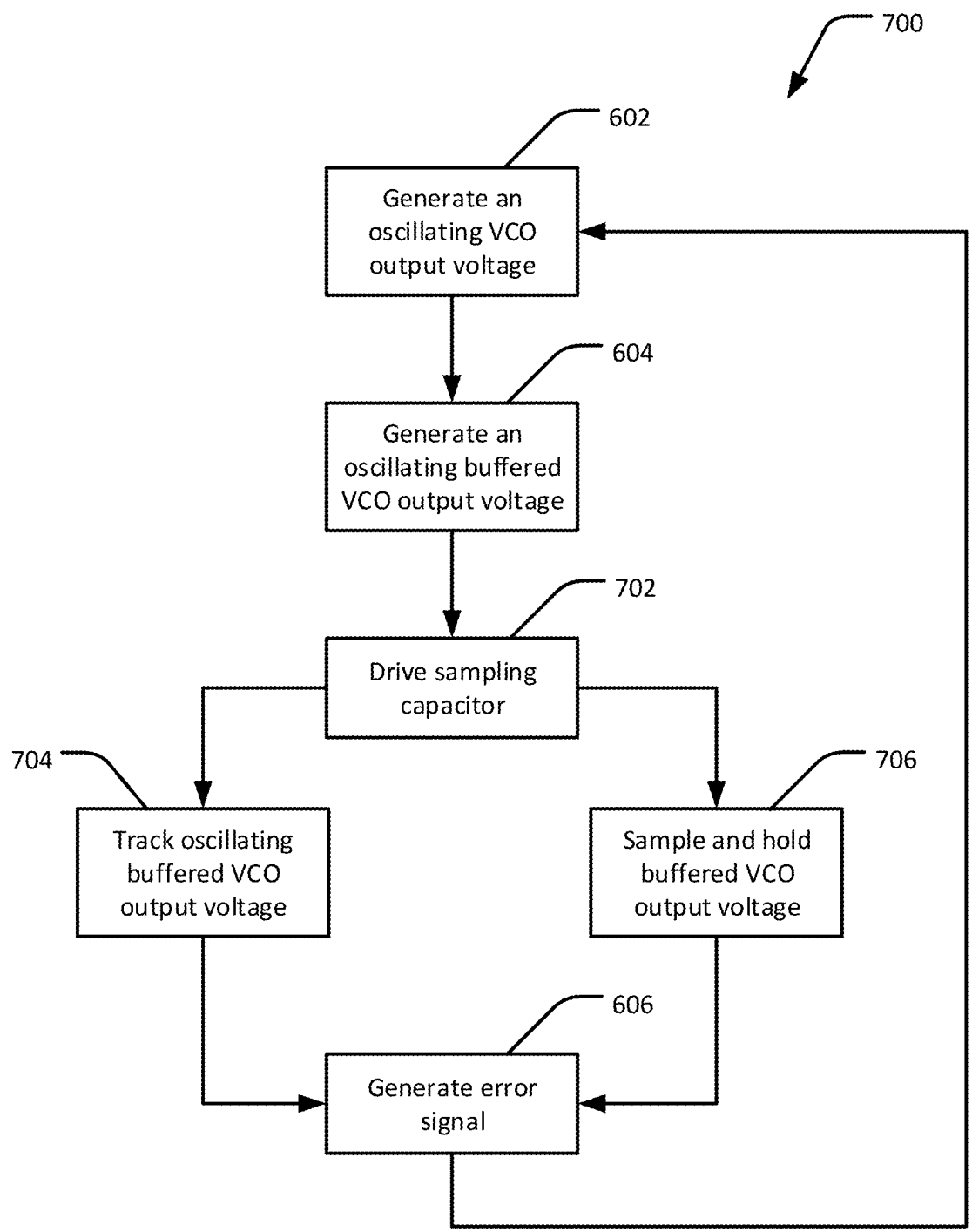
FIG. 7 is a block diagram of another example method of controlling a phase-locked loop control system, in accordance with an embodiment of the present disclosure.

FIG. 7 is a block diagram of another example method 700 of controlling a phase-locked loop control system, in accordance with an embodiment of the present disclosure. Some aspects of the method 700 are similar to the method 600 of FIG. 6. In some embodiments, the SEF circuit includes a sampling capacitor, and the method 700 includes driving 702 the sampling capacitor with a switched current source. In some embodiments, the SEF circuit is configured to operate in either or both of a track phase and a hold phase. In such embodiments, the method 700 includes, in the track phase, tracking 704, by the track-and-hold circuit, the oscillating buffered VCO output voltage, and in the hold phase, sampling and holding 706, by the track-and-hold circuit, the buffered VCO output voltage at a steady state. In some embodiments, the method 700 includes, in the track phase, causing an output of the SEF sampler to track the oscillating buffered VCO output voltage, where a bias current is configured to flow through the emitter-follower circuit. In some embodiments, the method 700 includes, in the hold phase, causing the oscillating buffered VCO output voltage to be sampled and held at the steady state across the sampling capacitor, where the switched current source is configured to be cut off from the emitter-follower circuit.

Figure 8:
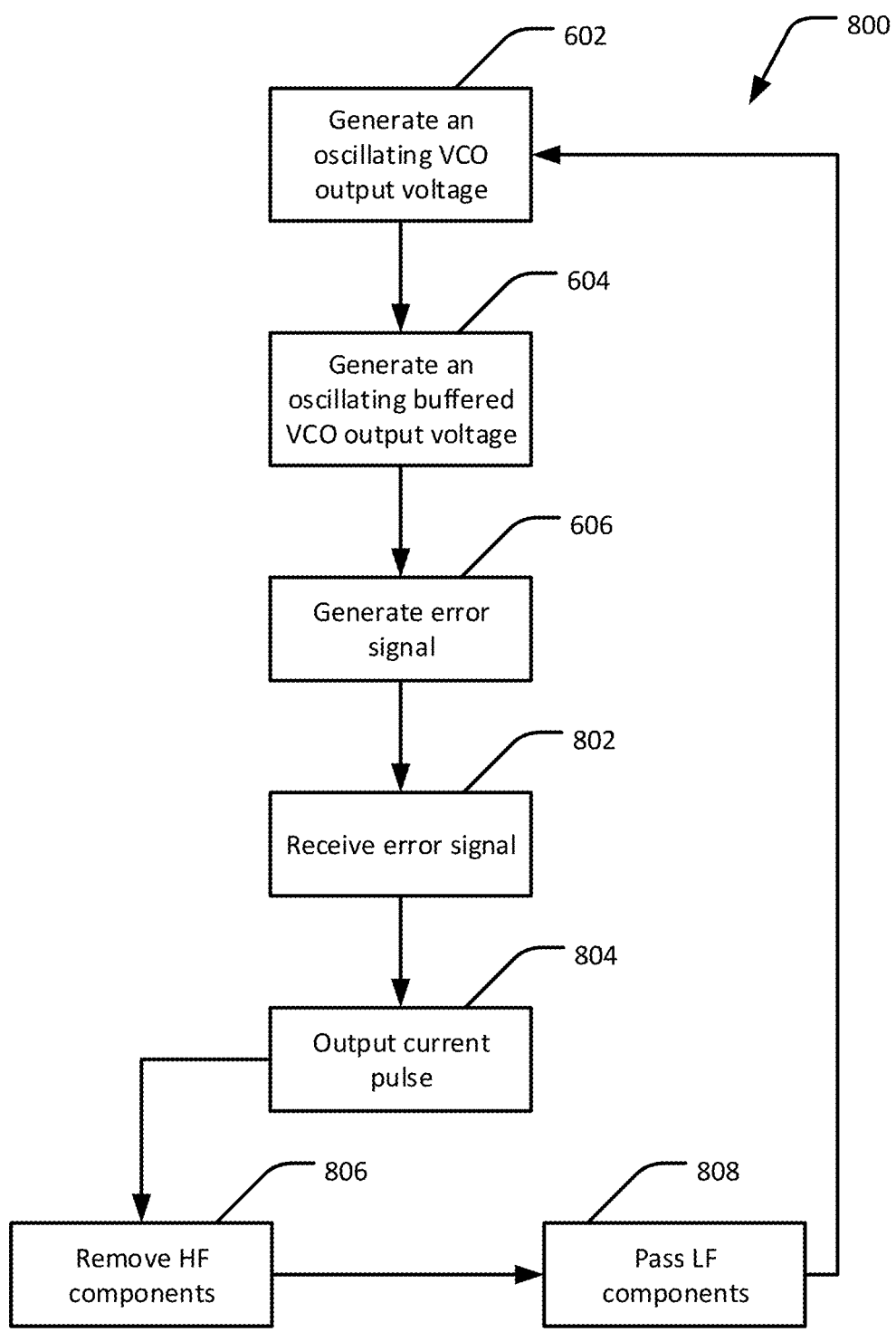
FIG. 8 is a block diagram of yet another example method of controlling a phase-locked loop control system, in accordance with an embodiment of the present disclosure.

FIG. 8 is a block diagram of another example method 800 of controlling a phase-locked loop control system, in accordance with an embodiment of the present disclosure. Some aspects of the method 800 are similar to the method 600 of FIG. 6. In some embodiments, the method 800 includes receiving 802, by a charge pump and/or an amplifier in electronic communication with the sub-sampling phase detector and the VCO circuit, the error signal, and outputting 804, by the charge pump and/or the amplifier, a current pulse having a width approximately equal to the amount of phase difference between the oscillating reference input voltage and the oscillating buffered VCO output voltage. In some embodiments, the method 800 includes causing, by a low pass filter in electronic communication with the sub-sampling phase detector and the VCO circuit, high-frequency components to be removed 806 from the current pulse, and causing, by the low pass filter, low-frequency components of the current pulse to be passed 808 to the VCO circuit.

Numerous embodiments will be apparent in light of the present disclosure, and features described herein can be combined in any number of configurations. One example embodiment provides a phase-locked loop control system. The system includes a voltage-controlled oscillator (VCO) circuit configured to generate an oscillating VCO output voltage based at least in part on an error signal that is proportional to a phase difference between an oscillating reference input voltage and the oscillating VCO output voltage. The system further includes a buffer circuit in electronic communication with the VCO circuit. The buffer circuit is configured to generate an oscillating buffered VCO output voltage that is based on and isolated from the oscillating VCO output voltage. The system further includes a sub-sampling phase detector in electronic communication with the buffer circuit. The sub-sampling phase detector includes a switched emitter-follower (SEF) circuit configured to generate the error signal based on the oscillating reference input voltage and the oscillating buffered VCO output voltage. In some cases, the SEF circuit includes a sampling capacitor configured to be driven by a switched current source. In some cases, the SEF circuit is configured to operate in each of a track phase and a hold phase, where in the track phase, the track-and-hold circuit tracks the oscillating buffered VCO output voltage, and where in the hold phase, the track-and-hold circuit samples and holds the buffered VCO output voltage at a steady state. In some such cases, in the track phase, a bias current is configured to flow through the emitter-follower circuit, causing an output of the SEF sampler to track the oscillating buffered VCO output voltage. In some other such cases, in the hold phase, the switched current source is configured to be cut off from the emitter-follower circuit, causing the oscillating buffered VCO output voltage to be sampled and held at the steady state across the sampling capacitor. In some cases, the system includes a charge pump and/or an amplifier in electronic communication with the sub-sampling phase detector and the VCO circuit. The charge pump and/or the amplifier are configured to receive the error signal and output a current pulse having a width approximately equal to the amount of phase difference between the reference input and the buffered VCO output voltage. In some cases, the system includes a low pass filter in electronic communication with the sub-sampling phase detector and the VCO circuit. The low pass filter is configured to remove high-frequency components from the current pulse and pass low-frequency components of the current pulse to the VCO circuit.

Another example embodiment provides a method of controlling a phase-locked loop control system. The method includes generating, by a voltage-controlled oscillator (VCO) circuit, an oscillating VCO output voltage based at least in part on an error signal that is proportional to a phase difference between an oscillating reference input voltage and the oscillating VCO output voltage. The method further includes generating, by a buffer circuit in electronic communication with the VCO circuit, an oscillating buffered VCO output voltage that is based on and isolated from the oscillating VCO output voltage. The method further includes generating, by a sub-sampling phase detector in electronic communication with the buffer circuit, the error signal based on the oscillating reference input voltage and the oscillating buffered VCO output voltage, where the sub-sampling phase detector includes a switched emitter-follower (SEF) circuit. In some cases, the SEF circuit includes a sampling capacitor, and the method includes driving the sampling capacitor with a switched current source. In some cases, the SEF circuit is configured to operate in each of a track phase and a hold phase, and the method includes, in the track phase, tracking, by the track-and-hold circuit, the oscillating buffered VCO output voltage, and/or in the hold phase, sampling and holding, by the track-and-hold circuit, the buffered VCO output voltage at a steady state. In some such cases, the method includes, in the track phase, causing an output of the SEF sampler to track the oscillating buffered VCO output voltage, where a bias current is configured to flow through the emitter-follower circuit. In some other such cases, the method includes, in the hold phase, causing the oscillating buffered VCO output voltage to be sampled and held at the steady state across the sampling capacitor, where the switched current source is configured to be cut off from the emitter-follower circuit. In some cases, the method includes receiving, by a charge pump and/or an amplifier in electronic communication with the sub-sampling phase detector and the VCO circuit, the error signal, and outputting, by the charge pump and/or the amplifier, a current pulse having a width approximately equal to the amount of phase difference between the oscillating reference input voltage and the oscillating buffered VCO output voltage. In some cases, the method includes causing, by a low pass filter in electronic communication with the sub-sampling phase detector and the VCO circuit, high-frequency components to be removed from the current pulse, and causing, by the low pass filter, low-frequency components of the current pulse to be passed to the VCO circuit.

Yet another example embodiment provides a phase-locked loop control system. The system includes a voltage-controlled oscillator (VCO) circuit configured to generate an oscillating VCO output voltage based at least in part on an error signal that is proportional to a phase difference between an oscillating reference input voltage and the oscillating VCO output voltage; and a means for generating the error signal. In some cases, the means for generating the error signal includes a switched emitter-follower (SEF) circuit configured to generate the error signal. In some cases, the system includes a buffer circuit in electronic communication with the VCO circuit. The buffer circuit is configured to generate an oscillating buffered VCO output voltage that is based on and isolated from the oscillating VCO output voltage, where the error signal is based on the oscillating reference input voltage and the oscillating buffered VCO output voltage. In some such cases, the means for generating the error signal is configured to operate in a track phase and/or a hold phase, where in the track phase, the track-and-hold circuit tracks the oscillating buffered VCO output voltage, and where in the hold phase, the track-and-hold circuit samples and holds the buffered VCO output voltage at a steady state. In some cases, in the track phase, a bias current is configured to flow through the emitter-follower circuit, causing an output of the SEF sampler to track the oscillating buffered VCO output voltage, and in the hold phase, the switched current source is configured to be cut off from the emitter-follower circuit, causing the oscillating buffered VCO output voltage to be sampled and held at the steady state across the sampling capacitor. In some cases, the system includes a charge pump and/or an amplifier in electronic communication with the means for generating the error signal and the VCO circuit, the charge pump and/or the amplifier configured to receive the error signal and output a current pulse having a width approximately equal to the amount of phase difference between the reference input and the buffered VCO output voltage; and/or a low pass filter in electronic communication with the sub-sampling phase detector and the VCO circuit, the low pass filter configured to remove high-frequency components from the current pulse and pass low-frequency components of the current pulse to the VCO circuit.

The foregoing description and drawings of various embodiments are presented by way of example only. These examples are not intended to be exhaustive or to limit the invention to the precise forms disclosed. Alterations, modifications, and variations will be apparent in light of this disclosure and are intended to be within the scope of the invention as set forth in the claims.

What is claimed is:

1. A phase-locked loop control system comprising:
    a voltage-controlled oscillator (VCO) circuit configured to generate an oscillating VCO output voltage based at least in part on an error signal that is proportional to a phase difference between an oscillating reference input voltage and the oscillating VCO output voltage;
    a buffer circuit communicatively coupled with the VCO circuit, the buffer circuit configured to generate an oscillating buffered VCO output voltage that is based on and isolated from the oscillating VCO output voltage; and
    a sub-sampling phase detector communicatively coupled with the buffer circuit, the sub-sampling phase detector including a switched emitter-follower (SEF) circuit configured to generate the error signal based on the oscillating reference input voltage and the oscillating buffered VCO output voltage.

2. The system of claim 1, wherein the SEF circuit includes a sampling capacitor configured to be driven by a switched current source.

3. The system of claim 1, wherein the SEF circuit is configured to operate in a track phase and/or a hold phase, wherein in the track phase, the track-and-hold circuit tracks the oscillating buffered VCO output voltage, and wherein in the hold phase, the track-and-hold circuit samples and holds the buffered VCO output voltage at a steady state.

4. The system of claim 3, wherein in the track phase, a bias current is configured to flow through the SEF circuit, causing an output of the SEF circuit to track the oscillating buffered VCO output voltage.

5. The system of claim 3, wherein in the hold phase, the switched current source is configured to be cut off from the SEF circuit, causing the oscillating buffered VCO output voltage to be sampled and held at the steady state across a sampling capacitor.

6. The system of claim 1, further comprising a charge pump and/or an amplifier in electronic communication with the sub-sampling phase detector and the VCO circuit, the charge pump and/or the amplifier configured to receive the error signal and output a current pulse having a width approximately equal to the phase difference between the reference input and the buffered VCO output voltage.

7. The system of claim 6, further comprising a low pass filter in electronic communication with the sub-sampling phase detector and the VCO circuit, the low pass filter configured to remove high-frequency components from the current pulse and pass low-frequency components of the current pulse to the VCO circuit.

8. A method of controlling a phase-locked loop control system, the method comprising:
    generating, by a voltage-controlled oscillator (VCO) circuit, an oscillating VCO output voltage based at least in part on an error signal that is proportional to a phase difference between an oscillating reference input voltage and the oscillating VCO output voltage;
    generating, by a buffer circuit in electronic communication with the VCO circuit, an oscillating buffered VCO output voltage that is based on and isolated from the oscillating VCO output voltage; and
    generating, by a sub-sampling phase detector in electronic communication with the buffer circuit, the error signal based on the oscillating reference input voltage and the oscillating buffered VCO output voltage, the sub-sampling phase detector including a switched emitter-follower (SEF) circuit.

9. The method of claim 8, wherein the SEF circuit includes a sampling capacitor, and wherein the method further comprises driving the sampling capacitor with a switched current source.

10. The method of claim 8, wherein the SEF circuit is configured to operate in a track phase and/or a hold phase, and wherein the method further comprises, in the track phase, tracking, by the track-and-hold circuit, the oscillating buffered VCO output voltage, and in the hold phase, sampling and holding, by the track-and-hold circuit, the buffered VCO output voltage at a steady state.

11. The method of claim 10, further comprising, in the track phase, causing an output of the SEF circuit to track the oscillating buffered VCO output voltage, wherein a bias current is configured to flow through the SEF circuit.

12. The method of claim 10, further comprising, in the hold phase, causing the oscillating buffered VCO output voltage to be sampled and held at the steady state across a sampling capacitor, wherein the switched current source is configured to be cut off from the SEF circuit.

13. The method of claim 8, further comprising receiving, by a charge pump and/or an amplifier in electronic communication with the sub-sampling phase detector and the VCO circuit, the error signal, and outputting, by the charge pump and/or the amplifier, a current pulse having a width approximately equal to the phase difference between the oscillating reference input voltage and the oscillating buffered VCO output voltage.

14. The method of claim 13, further comprising causing, by a low pass filter in electronic communication with the sub-sampling phase detector and the VCO circuit, high-frequency components to be removed from the current pulse, and causing, by the low pass filter, low-frequency components of the current pulse to be passed to the VCO circuit.

15. A phase-locked loop control system comprising:
a voltage-controlled oscillator (VCO) circuit configured to generate an oscillating VCO output voltage based at least in part on an error signal that is proportional to a phase difference between an oscillating reference input voltage and the oscillating VCO output voltage;
a buffer circuit in electronic communication with the VCO circuit, the buffer circuit configured to generate an oscillating buffered VCO output voltage that is based on and isolated from the oscillating VCO output voltage, wherein the error signal is based on the oscillating reference input voltage and the oscillating buffered VCO output voltage; and
a means for generating the error signal.

16. The system of claim 15, wherein the means for generating the error signal includes a switched emitter-follower (SEF) circuit configured to generate the error signal.

17. The system of claim 15, wherein the means for generating the error signal is configured to operate in a track phase and/or a hold phase, wherein in the track phase, the track-and-hold circuit tracks the oscillating buffered VCO output voltage, and wherein in the hold phase, the track-and-hold circuit samples and holds the buffered VCO output voltage at a steady state.

18. The system of claim 16, wherein the SEF circuit includes a sampling capacitor configured to be driven by a switched current source, and wherein the SEF circuit is configured to operate in a track phase and/or a hold phase, wherein in the track phase, a bias current is configured to flow through the SEF circuit, causing an output of the SEF circuit to track the oscillating buffered VCO output voltage, and wherein in the hold phase, the switched current source is configured to be cut off from the SEF circuit, causing the oscillating buffered VCO output voltage to be sampled and held at the steady state across the sampling capacitor.

19. The system of claim 15, further comprising:
a charge pump and/or a differential pair amplifier in electronic communication with the means for generating the error signal and the VCO circuit, the charge pump and/or the differential pair amplifier configured to receive the error signal and output a current pulse having a width approximately equal to the phase difference between the reference input and the buffered VCO output voltage; and/or
a low pass filter in electronic communication with the means for generating the error signal and the VCO circuit, wherein the low pass filter passes low frequency components of the current pulse to the VCO circuit and removes high frequency components, and wherein the current pulse comprises low frequency components and high frequency components.

* * * * *